(12) United States Patent
Murata

(10) Patent No.: US 6,917,745 B2
(45) Date of Patent: Jul. 12, 2005

(54) PLATFORM AND OPTICAL MODULE, MANUFACTURING METHOD OF THE SAME, AND OPTICAL TRANSMISSION DEVICE

(75) Inventor: Akihiro Murata, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 537 days.

(21) Appl. No.: 09/800,483

(22) Filed: Mar. 8, 2001

(65) Prior Publication Data

US 2002/0024159 A1 Feb. 28, 2002

(30) Foreign Application Priority Data

Apr. 7, 2000 (JP) .......................................... 2000-106401

(51) Int. Cl.⁷ ................................................ G02B 6/00
(52) U.S. Cl. ...................................................... 385/137
(58) Field of Search ........................... 385/137, 92, 49, 385/88, 91, 90, 94

(56) References Cited

U.S. PATENT DOCUMENTS

| 6,177,689 B1 | * | 1/2001 | Torazawa | 257/81 |
| 6,270,263 B1 | * | 8/2001 | Iwase et al. | 385/92 |
| 6,517,259 B1 | * | 2/2003 | Murata | 385/92 |
| 6,632,027 B1 | * | 10/2003 | Yoshida et al. | 385/88 |

* cited by examiner

*Primary Examiner*—Javaid H. Nasri
(74) *Attorney, Agent, or Firm*—Oliff & Berridge PLC

(57) ABSTRACT

A method of manufacturing a platform comprising the steps of: providing an interconnecting line adhered to first and second regions of a mold; disposing a pin with a tip facing the mold; sealing the pin and interconnecting line with a molding material; curing the molding material; removing the pin from the molding material to form a through hole; and removing the molding material together with the interconnecting line from the mold.

34 Claims, 18 Drawing Sheets

PLATFORM AND OPTICAL MODULE, MANUFACTURING METHOD OF THE SAME, AND OPTICAL TRANSMISSION DEVICE

BACKGROUND OF THE INVENTION

1. Field of the Invention

The present invention relates to a platform and optical module, a method of manufacture thereof, and an optical transmission device.

2. Description of Related Art

In recent years, there has been a trend toward increased speeds and volumes in data communications, and developments in optical communications continue. In optical communications, an electrical signal is converted to an optical signal, the optical signal is transmitted through an optical fiber, and then the received optical signal is converted to an electrical signal. The conversion between electrical signals and optical signals is done by optical elements. An optical module comprising an optical element mounted on a platform is also known.

Conventionally, the method is known of forming interconnecting lines on an injection molding by electroless plating or the like, to fabricate a component. This method can be applied to the fabrication of a platform. However, in that case, since the interconnecting lines are formed on the surface of the injection molding, the surface of the platform has convexities formed by the interconnecting lines, and its planarity cannot be assured.

SUMMARY OF THE INVENTION

According to the present invention, there is provided a method of manufacturing a platform comprising the steps of:

providing a mold having first and second regions with an interconnecting line adhered to the first or second region;

disposing a pin with a tip of the pin facing the mold;

sealing the interconnecting line and the pin with a molding material;

removing the pin from the molding material to form a through hole in the molding material; and releasing the interconnecting line and the molding material from the mold.

A method of manufacturing an optical module of the present invention comprises the steps of:

manufacturing a platform by the above-described method;

inserting an optical fiber into the through hole formed in the platform;

mounting an optical element on the platform; and electrically connecting the optical element and the interconnecting line.

A platform of the present invention comprises:

a molded component formed of resin;

an interconnecting line in the molded component, at least part of the interconnecting line being exposed; and a through hole in which an optical fiber is inserted is formed in the molded component.

An optical module of the present invention comprises:

the above-described platform;

an optical fiber inserted in the through hole; and an optical element electrically connected to the interconnecting line and mounted over the platform.

An optical transmission device of the present invention comprises:

a plurality of the above-described platforms;

an optical element mounted over each of the platforms; and the optical fiber attached to each of the platforms, wherein the optical element is a light-receiving element or light-emitting element; and wherein the optical element is electrically connected to the exposed part of the interconnecting line.

DETAILED DESCRIPTION OF THE EMBODIMENTS

Figure 1:
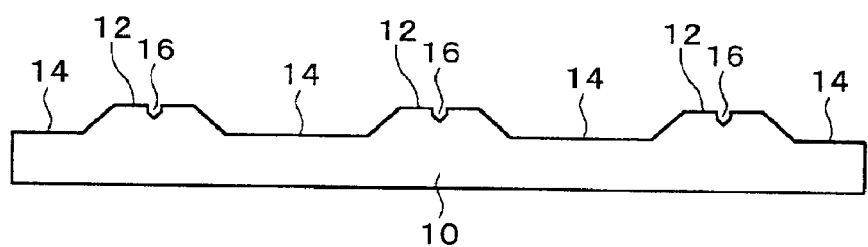
FIG. 1 shows a method of manufacturing a platform according to a first embodiment of the present invention.

Embodiments of the present invention are now described. This embodiment solves the above mentioned problem, and has as its objective the provision of a platform and optical module having no projection formed by an interconnecting line, methods of manufacture thereof, and an optical transmission device.

(1) The method of manufacturing a platform according to the embodiments of the present invention comprises the steps of:

providing a mold having first and second regions with an interconnecting line adhered to the first or second region;

disposing a pin with a tip of the pin facing the mold;

sealing the interconnecting line and the pin with a molding material;

removing the pin from the molding material to form a through hole in the molding material; and releasing the interconnecting line and the molding material from the mold.

According to this method, an end portion of the interconnecting line is adhered to the mold, and then the interconnecting line is sealed with the molding material. Portions of the interconnecting line other than the surfaces adhered to the mold are sealed with the molding material. Then the molding material is formed by the mold, and when the interconnecting line together with the molding material is removed from the mold, the interconnecting line is embedded in the molding material except for the surfaces adhered to the mold. Therefore, projections are not formed by the interconnecting lines. An optical fiber can be inserted in the through hole formed by removing the pin from the molding material.

(2) In this method of manufacturing a platform, the interconnecting line may be a wire; and both ends of the wire may be bonded to the first and second regions.

By means of this, a platform can be obtained in which the surfaces of both ends of the wire adhered to the mold are exposed, and other portions are sealed internally. Since the wire is sealed, breaks therein can be prevented.

(3) In this method of manufacturing a platform, bonding pads may be previously provided; and both ends of the wire may be bonded to the bonding pads.

Even if the mold is formed of a material which does not allow of easy wire bonding, wire bonding is made possible by the formation of the bonding pad.

(4) In this method of manufacturing a platform, the interconnecting line may be a conductive layer; and the conductive layer may be formed over the first and second regions.

By means of this, a platform can be obtained in which the surfaces of the conductive layer adhered to the mold are exposed, but other portions are sealed internally.

(5) In this method of manufacturing a platform, a mold release agent may be applied to at least one of the mold and the pin when the interconnecting line and the pin are sealed by the molding material.

The mold release characteristics of the molding material from the mold and pin can be thus improved.

(6) In this method of manufacturing a platform, the end of the pin may be inserted into a hole formed in the mold.

Since the end of the pin is in the hole formed in the mold and not covered by the molding material, a through hole can be formed in the molding material.

(7) In this method of manufacturing a platform, the first region of the mold may be formed to be substantially planar; and the hole may be formed in the first region.

By means of this, the through hole is formed in a surface of the molding material molded by the first region of the mold.

(8) In this method of manufacturing a platform, the mold may have a projected portion within the first region; and the hole may be formed in a top surface of the projected portion.

By means of this, an indent is formed in the molding material by the projected portion of the mold. Since there is a hole into which the pin is inserted in the projected portion of the mold, a through hole is formed in a bottom surface of the indent.

(9) In this method of manufacturing a platform, the first region of the mold may project further than the second region to form an indent in the molding material.

For example, the indent may be formed of a size and depth to contain an optical element.

(10) In this method of manufacturing a platform, the mold may have a projection;

the interconnecting line may be adhered to a region of the projection; and the projection may form a recess in the molding material.

By means of this, a construction which achieves electrical connection between the interconnecting line and other components on an inner surface of the recess can be obtained.

(11) This method of manufacturing a platform may further comprise:

a step of filling the recess with a conductive material.

The interconnecting line and other components can be thus electrically connected by the conductive material.

(12) In this method of manufacturing a platform, an electronic component may be electrically connected to the interconnecting line and mounted over the mold; and the molding material may seal the electronic component together with the interconnecting line.

A platform incorporating an electronic component can be thus obtained.

(13) In this method of manufacturing a platform, the mold may include the first region, the second region provided in a position lower than the first region, and a third region provided between the first and the second regions; and the interconnecting line may be adhered to the first or second region and also to the third region in the step of providing the interconnecting line.

A multiply stepped indent can be formed in the molding material by the multiply stepped mold. An optical element or semiconductor chip or the like can be provided within the indent.

(14) In this method of manufacturing a platform, the mold may have a plurality of the first and second regions;

a plurality of the pins may be disposed with tips of the pins facing the mold; and the plurality of pins may be removed from the molding material to form a plurality of the through holes in the molding material.

By means of this, a plurality of through holes in which a plurality of optical fibers are to be inserted can be formed in the molding material.

(15) This method of manufacturing a platform may further comprise a step of cutting the molding material.

This makes it possible to manufacture a plurality of platforms from the molding material. It should be noted that the molding material may be cut corresponding to each through hole, to manufacture platforms each having formed a single through hole, or a region having a plurality of through holes may be cut, and platforms each having formed a plurality of through holes may be manufactured.

(16) A method of manufacturing an optical module according to the embodiments of the present invention comprises the steps of:

manufacturing a platform by the above-described method;

inserting an optical fiber into the through hole formed in the platform;

mounting an optical element over the platform; and electrically connecting the optical element and the interconnecting line.

According to this method, the effect described in the method of manufacturing a platform can be achieved. Moreover, an optical element can be mounted over the platform in which projections due to interconnecting lines are not formed.

(17) This method of manufacturing an optical module may further comprise:

a step of providing a resin to seal the optical element.

The optical element can be thus protected.

(18) In this method of manufacturing an optical module, as the resin, a resin having light transmitting properties may be provided at least between the optical fiber and the optical element.

(19) In this method of manufacturing an optical module, the platform may be manufactured by the above-described method; and a semiconductor chip may be provided in the third region of the platform.

According to this method, a multiply stepped indent can be formed in the platform, and an optical element or semiconductor chip can be provided within the indent in a compact way.

(20) A platform according to the embodiments of the present invention comprises:

a molded component formed of resin;

an interconnecting line in the molded component, at least part of the interconnecting line being exposed; and a through hole in which an optical fiber is inserted is formed in the molded component.

Since the interconnecting line is embedded in the molded component except for a part, projections due to the interconnecting line are not formed.

(21) In this platform, an indent for receiving an optical element may be formed in the molded component.

It should be noted that the indent may be formed of a size and depth to contain an optical element.

(22) In this platform, the indent may have a plurality of bottom surfaces in stepped form; and the at least part of the interconnecting line may be exposed on each of the bottom surfaces.

Since this indent has a multiply stepped form, an optical element or semiconductor chip or the like can be mounted on each step.

(23) In this platform, a recess may be formed in the interconnecting line so that a bottom surface of the recess is exposed from the molded component.

By means of this, the electrical connection between the interconnecting line and other components can be achieved on a bottom surface of the recess.

(24) In this platform, the recess formed in the interconnecting line may be filled with a conductive material.

The interconnecting line and other components can be electrically connected through the conductive material.

(25) In this platform, an electronic component may be incorporated in the molded component and be electrically connected to the interconnecting line.

By means of this, a platform incorporating an electronic component can be obtained.

(26) An optical module according to the embodiments of the present invention comprises:

the above-described platform;

an optical fiber inserted in the through hole; and an optical element electrically connected to the interconnecting line and mounted over the platform.

According to this optical module, an optical element is mounted over the platform in which projections due to the interconnecting lines are not formed. The interconnecting line is protected by being embedded in the resin molded component.

(27) An optical module according to the embodiments of the present invention comprises: the above described platform; an optical fiber inserted in the through hole; and an optical element electrically connected to the interconnecting line and mounted over the platform, wherein the optical element is provided within the indent so as to face an end surface of the optical fiber facing in the direction of the indent; and wherein a semiconductor chip which is electrically connected to the interconnecting line is further provided within the indent to face a surface of the optical element opposite to the surface facing the optical fiber.

According to this optical module, the indent has a multiply stepped form, and an optical element or semiconductor chip or the like can be provided within the indent in a compact way.

(28) This optical module may further comprise a resin to seal the optical element.

The optical element can be thus protected.

(29) In this optical module, as the resin, a resin having light transmitting properties may be provided at least between the optical fiber and the optical element.

(30) An optical transmission device according to the embodiments of the present invention comprises:

a plurality of the above-described platforms;

an optical element mounted over each of the platforms; and the optical fiber attached to each of the platforms, wherein the optical element is a light-receiving element or light-emitting element; and wherein the optical element is electrically connected to the exposed part of the interconnecting line.

According to this optical transmission device, an optical element is mounted over the platform in which projections due to the interconnecting lines are not formed. The interconnecting line is protected by being embedded in the resin molded component.

(31) In this optical transmission device having the above described platform, an indent for receiving the optical element may be formed in the molded component;

a semiconductor chip may be mounted over each of the platforms;

the optical element may be provided within the indent to face an end surface of the optical fiber facing in the direction of the indent; and the semiconductor chip may be electrically connected to the interconnecting line, and be provided within the indent to face a surface of the optical element opposite to the surface facing the optical fiber.

By means of this, the indent has a multiply stepped form, and an optical element or semiconductor chip or the like can be contained in the indent in a compact way.

(32) This optical transmission device may further comprise a resin to seal the optical element.

The optical element can be thus protected.

(33) In this optical transmission device, as the resin, a resin having light transmitting properties may be provided at least between the optical fiber and the optical element.

(34) This optical transmission device may further comprise: a plug connected to the optical element.

First Embodiment

FIGS. 1 to 7 show a first embodiment of the method of manufacture of a platform according to the present invention. In this embodiment, a mold 10 shown in FIG. 1 is used.

The mold 10 has on its surface at least one (a plurality in FIG. 1) first region 12, and on the periphery thereof a second region 14. A plurality of first regions 12 may be arranged in a matrix form. In this embodiment, using the mold 10, a plurality of platforms can be manufactured.

The first region 12 may be formed to project more than the second region 14. In that case, as shown in FIG. 1, the first and second regions 12 and 14 are preferably connected by an inclined surface (taper surface) from the second region 14. By means of this form, a molding material 40 described below (see FIG. 6) has good mold release characteristics. Alternatively, first and second regions 12 and 14 may be connected by a surface rising perpendicularly from the second region 14.

The mold 10 may be formed of resin, glass, ceramic, or metal, but if silicon (for example a silicon wafer) is used, fine machining can be carried out by etching. Depending on the etching conditions, the form of the surface connecting the first and second regions 12 and 14 (taper surface or perpendicular surface) may be determined.

The surface of the first region 12 is formed to be substantially planar. The surface of the second region 14 is also formed to be substantially planar. In the first region 12 a hole 16 is formed. The hole 16 is such that the ends of pins 32 and 34 (see FIG. 3) are inserted, and the positioning thereof can thus be achieved. The hole 16 is preferably precisely formed. When the mold 10 is formed of silicon, the hole 16 can be formed with high precision by etching.

Figure 2:
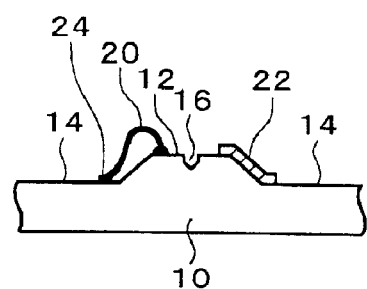
FIG. 2 shows a method of manufacturing a platform according to the first embodiment of the present invention.

In this embodiment, as shown in FIG. 2, the mold 10 is provided with interconnecting lines 20 and 22. In more detail, the interconnecting lines 20 and 22 are provided with their ends adhered to the first and second regions 12 and 14.

The interconnecting line 20 shown in FIG. 2 is formed by bonding both ends of a wire to the first and second regions 12 and 14. It should be noted that in the first region 12, the wire is bonded to avoid the hole 16. The wire may be bonded by the wire bonder used in the fabrication of a semiconductor device. In that case, bonding is carried out by means of at least one of heat, pressure, and ultrasonic vibration. The wire may be of gold or aluminum.

When the mold 10 is formed of a material such as silicon or the like to which the metoal of which the wire is formed does not adhere easily, a bonding pad 24 is preferably previously formed on the mold 10. The bonding pad 24 may be a conductive film or if not electrically conductive, a film such that the wire can be attached. In this case, the wire and bonding pad 24 integrally form the interconnecting line 20. The surface of the bonding pad 24 may be formed of the same material as the wire. For example, when the wire is of gold, the bonding pad 24 may be formed of a film of chromium, with a film of gold formed thereon.

The interconnecting line 22 shown in FIG. 2 is a conductive layer. The conductive layer may be a metal foil formed by vapor deposition or plating. When electroless plating is applied as the plating, a catalyst may be applied using inkjet technology. The conductive layer may be formed by the application of printing, potting, or inkjet technology. The material of the conductive layer may be a conductive paste. The interconnecting line 22 if formed of metal foil may be adhered to the mold 10 for its entire length. The interconnecting line 22 if formed of conductive paste may have an end adhered to the first region 12, an intermediate portion in a floating state, and the other end adhered to the second region 14.

The interconnecting lines 20 and 22 are preferably easily released from the mold 10. For example, if the interconnecting line 22 is formed by plating with tin or the like, it will be easily released. If the interconnecting line 22 is formed by printing, the interconnecting line 22 can be relatively easily released.

Figure 3:
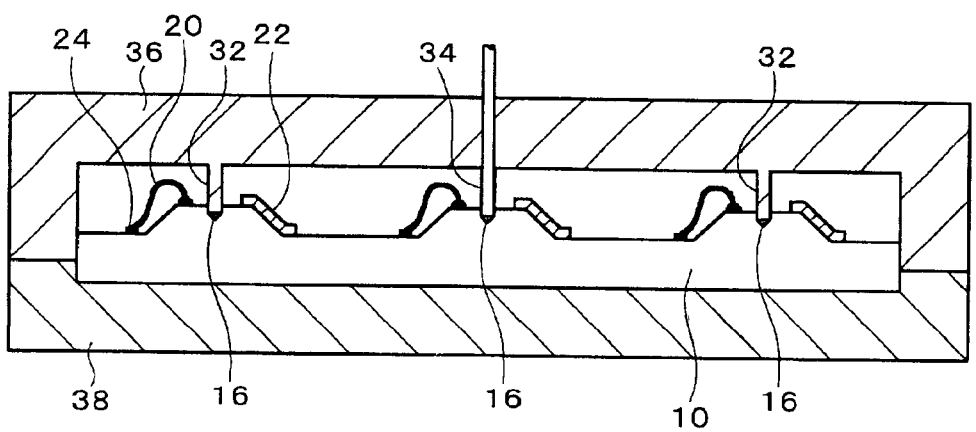
FIG. 3 shows a method of manufacturing a platform according to the first embodiment of the present invention.

Next, as shown in FIG. 3, the mold 10 is disposed within the cavity formed by an upper die 36 and lower die 38. In the lower die 38 is preferably formed a guide capable of positioning the mold 10.

Then, the ends of pins 32 and 34 are disposed facing the mold 10. In more detail, the pins 32 and 34 are inserted into the hole 16 formed in the mold 10. The pin 32 is fixed to the upper die 36, and when the upper die 36 and lower die 38 are closed, the pin 32 is adapted to enter the hole 16. The pin 34 functions as a pressing-out pin when the mold is opened. The pins 32 and 34 form a through hole 44 in the molding material 40 in which the optical fiber 30 is inserted. Therefore, the pins 32 and 34 are of a shape corresponding to that of the optical fiber 30.

If required, a mold release agent (not shown in the drawings) is applied to the mold 10. The mold release agent (lubricant) has low adhesion with the molding material 40, and by applying the mold release agent, the mold release characteristics from the mold 10 of the molding material 40 are improved. If the mold release agent is also applied to the pins 32 and 34, the pins 32 and 34 can be more easily removed from the molding material 40.

Figure 4:
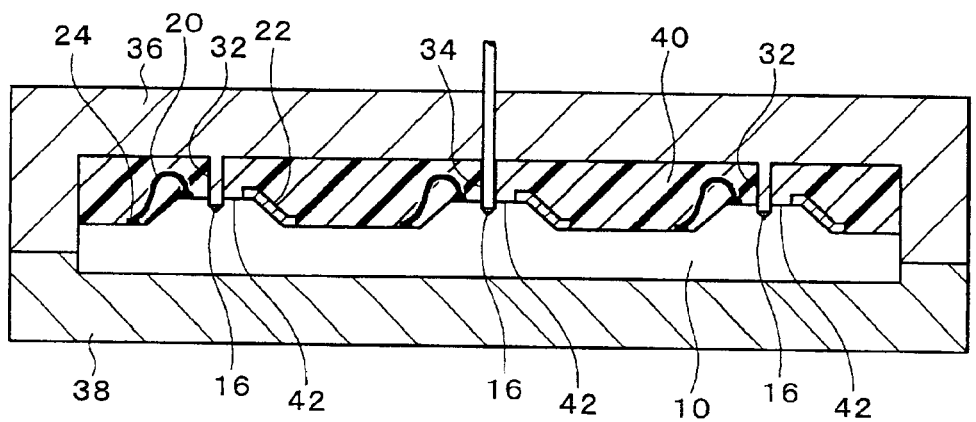
FIG. 4 shows a method of manufacturing a platform according to the first embodiment of the present invention.

As shown in FIG. 4, the interconnecting lines 20 and 22 and pins 32 and 34 are sealed with the molding material 40. The interconnecting line 20 formed by wire bonding is sealed by the forming resin 40, whereby breaks in the wire are prevented. Except for the surface of contact with the mold 10, the interconnecting line 22 formed of the conductive layer is covered by the molding material 40.

In this embodiment, molding material 40 is a molding resin, and the cavity formed by the upper die 36 and lower die 38 is filled with the molding material 40, but the molding material 40 may be equally provided by potting.

The molding material 40 is provided to avoid the end surfaces of the pins 32 and 34. Since the ends of the pins 32 and 34 are inserted in the hole 16, the end surfaces of the pins 32 and 34 are not covered by the molding material 40. The hole 16 is preferably of the minimum depth required to allow the ends of the pins 32 and 34 to enter. In particular, the hole 16 is preferably formed with a depth to extend below the surface of the second region 14.

The surface form of the molding material 40 is shaped by the surface of the first and second regions 12 and 14 of the mold 10 and by the inner surface of the upper die 36. Since the first region 12 projects more than the second region 14, an indent 42 is formed in the molding material 40. A mold release agent may be mixed with the molding material 40, and the mold release characteristics from the mold 10 improved.

Figure 5:
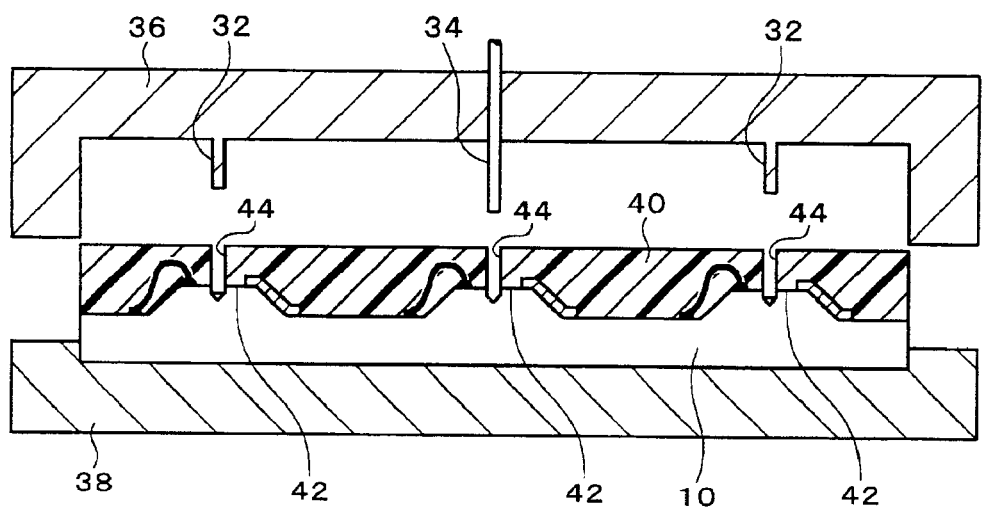
FIG. 5 shows a method of manufacturing a platform according to the first embodiment of the present invention.

As shown in FIG. 5, the molding material 40 is cured, and using the pin 34 (pressing-out pin), the upper die 36 and lower die 38 are separated. The pins 32 and 34 are removed from the molding material 40. By means of this, a through hole 44 is formed in the molding material 40.

Figure 6:
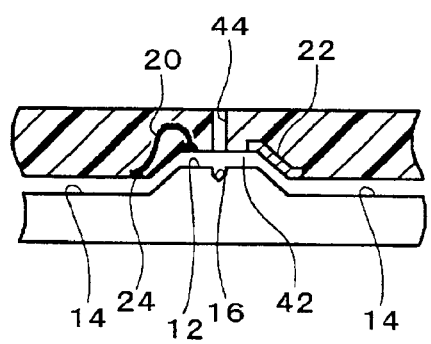
FIG. 6 shows a method of manufacturing a platform according to the first embodiment of the present invention.

As shown in FIG. 6, the molding material 40 is released from the mold 10. Together with the molding material 40, the surfaces of the interconnecting lines 20 and 22 adhered to the mold 10 are released from the mold 10. The interconnecting line 20 has the end surface of the wire and the surface of the bonding pad 24 released from the mold 10. The interconnecting line 22 formed of a conductive layer is adhered to the mold 10 over its whole length, and therefore is released from the mold 10 over the whole length of its surface.

In this embodiment, the mold 10 has a plurality of first regions 12. Each first region 12 forms a region of mounting the optical element 50 shown in FIG. 9 on the molding material 40. By means of the plurality of first regions 12, regions are formed on the molding material 40 for a plurality of optical elements 50 to be mounted.

Figure 7:
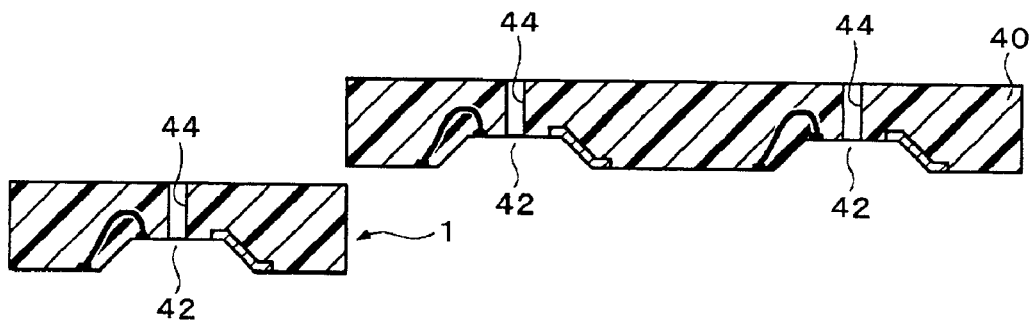
FIG. 7 shows a method of manufacturing a platform according to the first embodiment of the present invention.

As shown in FIG. 7, the molding material 40 is cut, and a platform 1 is obtained. The molding material 40 is cut in positions in accordance with requirements. The platform 1 has a formed body formed from the molding material (for example resin) 40. In the formed body is formed the indent 42. In the example shown in FIG. 7, the example has the molding material 40 cut for each single indent 42. The indent 42 is preferably of a size adequate to contain the optical element 50 (see FIG. 9). If the inner wall of the indent 42 has a taper, the optical element 50 can be inserted more easily. The interconnecting lines 20 and 22 are embedded in the formed body with a part exposed. The interconnecting line 20 has the surface of the end of the wire or the surface of the bonding pad 24 to which the wire is bonded exposed from the formed body. The interconnecting line 22 is exposed along the entire length of its surface. The interconnecting lines 20 and 22 are exposed in interior surface (bottom surface) of the indent 42 and on the periphery of the indent 42. That is to say, the interconnecting lines 20 and 22 have a first exposed portion on the surface formed in the first region 12 of the mold 10 described above, and a second exposed portion on the surface formed in the second region 14 of the mold 10.

Figure 8:
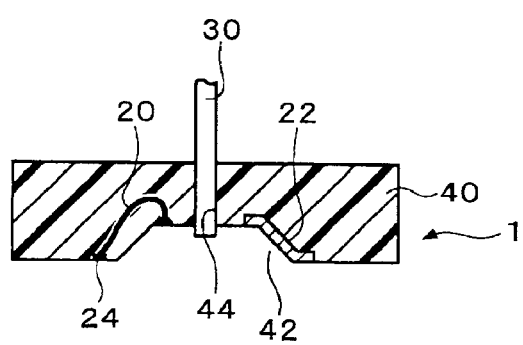
FIG. 8 shows a method of manufacturing an optical module according to the first embodiment of the present invention.

As shown in FIG. 8, the optical fiber 30 is attached to the platform 1. In more detail, the optical fiber 30 is inserted in the through hole 44 formed in the platform 1. If required, an adhesive is provided between the through hole 44 and the optical fiber 30. Thus, the optical fiber 30 is fixed to the platform 1 with its end surface exposed. In more detail, within the indent 42 formed in the platform 1, the optical fiber 30 is fixed with its end surface exposed. The end of the optical fiber 30 projects from the bottom surface of the indent 42. The length of this projection is preferably a length such as not to contact the optical part of the optical element 50.

The optical fiber 30 includes a core surrounded by a concentric circular cladding, and light is reflected by the boundary between the core and the cladding, to be contained within the core and thus transmitted. Around the periphery, the cladding is commonly protected by a jacket.

Figure 9:
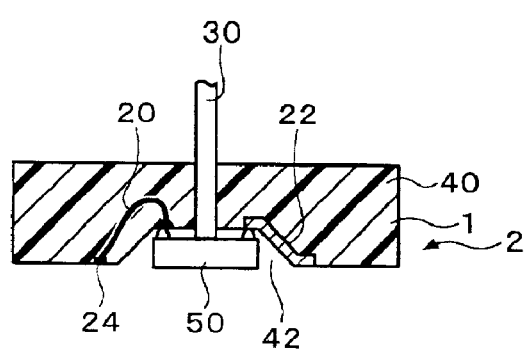
FIG. 9 shows a method of manufacturing an optical module according to the first embodiment of the present invention.

Next, as shown in FIG. 9, the optical element 50 is mounted on the platform 1. The optical element 50 may equally be a light-emitting element or a light-receiving element. As an example of a light-emitting element, a surface light-emitting element, and particularly a surface light-emitting laser can be used. A surface light-emitting element such as a surface light-emitting laser or the like emits light perpendicularly from the surface. The optical element 50 has an optical part not shown in the drawings. When the optical element 50 is a light-emitting element, the optical part is a light-emitting part, and when the optical element 50 is a light-receiving element, the optical part is a light-receiving part.

The optical element 50 commonly has electrodes formed on the side on which the optical part is formed and on the side opposite thereto. That is to say, the optical element 50 has electrodes formed on front and rear surfaces, and a voltage is applied between the electrodes. It should be noted that the optical element 50 shown in FIG. 9 has a bump (or solder ball or the like) formed on the electrode formed on the side on which the optical part is formed.

The optical element 50 is mounted in the indent 42 formed in the platform 1. The optical element 50 maybe contained within the depth of the indent 42. The optical element 50 is mounted on the platform 1 with an optical part not shown in the drawings facing the exposed end surface of the optical fiber 30. Then the electrode on the side on which the optical part is formed and the exposed portion of the interconnecting lines 20 and 22 of the platform 1 are electrically connected (or bonded).

In this way, the optical module 2 shown in FIG. 9 is obtained. The optical module 2 has the electrode of the optical element 50 on the side on which the optical part is formed electrically connected to the first exposed portion of the interconnecting lines 20 and 22 (the exposed portion within the indent 42). Therefore, electrical connection to the optical element 50 can be achieved from the second exposed portion of the interconnecting lines 20 and 22 (the exposed portion formed around the periphery of the indent 42 in the platform 1). On the rear surface of the optical element 50 (the surface opposite to the surface on which the optical part is formed) also, an electrode not shown in the drawings is formed. From the above, the optical module 2 has a plurality of external terminals (electrode on the side of the optical element 50 opposite to the optical part and the second exposed portion of the interconnecting lines 20 and 22) on the surface on the opposite side to the direction in which the optical fiber 30 is brought out so that a voltage can be applied to the optical element 50.

Figure 10:
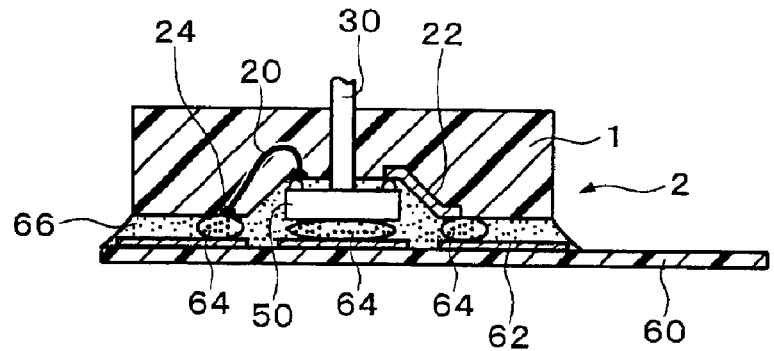
FIG. 10 shows a method of manufacturing an optical module according to the first embodiment of the present invention.

As shown in FIG. 10, the optical module 2 may be attached to a substrate 60. On the substrate 60, the interconnecting pattern 62 is formed. The plurality of external terminals of the optical module 2 (electrode on the side of the optical element 50 opposite to the optical part, and the second exposed portion of the interconnecting lines 20 and 22) and the interconnecting pattern 62 are electrically connected by a conductive material 64. The conductive material 64 may be a brazing material such as solder or the like, or a conductive paste, or may be an anisotropic conductive film or anisotropic conductive paste.

A resin 66 for sealing the optical element 50 is preferably provided. In the example shown in FIG. 10, the resin 66 is provided between the substrate 60 and the optical module 2, and therefore is an underfill. If a gap is formed between the optical part of the optical element 50 (not shown in the drawings) and the end surface of the optical fiber 30, at least the resin 66 with which this gap is filled is a transparent resin. When the optical part of the optical element 50 (not shown in the drawings) and the end surface of the optical fiber 30 are in intimate contact, the resin 66 need not be light-transmitting.

Figure 11:
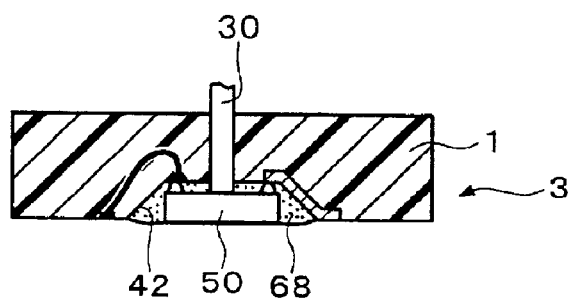
FIG. 11 shows a method of manufacturing an optical module according to the first embodiment of the present invention.

FIG. 11 shows another example, an optical module 3. The optical module 3 has the indent 42 formed in the platform 1 filled with a resin 68. If a gap is formed between the optical part (not shown in the drawings) of the optical element 50 and the end surface of the optical fiber 30, at least the resin 68 with which this gap is filled is a transparent resin. When the optical part (not shown in the drawings) of the optical element 50 and the end surface of the optical fiber 30 are in intimate contact, the resin 68 need not be light-transmitting.

Figure 12:
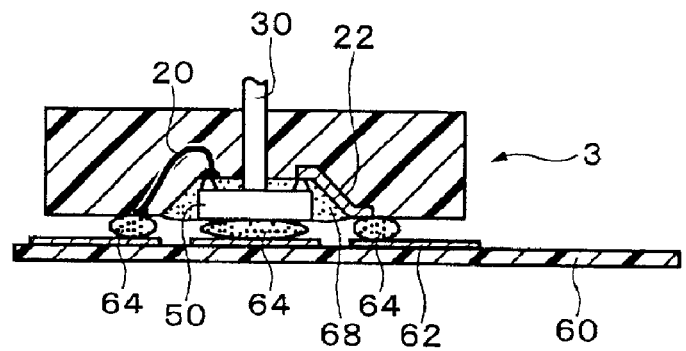
FIG. 12 shows a method of manufacturing an optical module according to the first embodiment of the present invention.

The optical module 3 shown in FIG. 11, as shown in FIG. 12, may be mounted on the substrate 60. On the substrate 60, the interconnecting pattern 62 is formed. The optical module 3 and interconnecting pattern 62 are electrically connected. The optical module 3 has the optical element 50 sealed by the resin 68, and after attachment to the substrate 60, while filling with an underfill material is not necessarily required, such filling may be done. If the conductive material 64 is a conductive adhesive, the electrical connection and adhesion can be carried out simultaneously.

As described above, according to this embodiment, the platform 1 can be formed by a simple process, and as a result of this process, convexities are not formed on the platform 1 by the interconnecting lines 20 and 22. The optical modules 2 and 3 having the platform 1 have the interconnecting lines 20 and 22, but a portion of the flat surface forms the electrical connection portions (exposed portions). Therefore, the process of attaching the optical modules 2 and 3 to the substrate 60 can be carried out easily.

Second Embodiment

Figure 13:
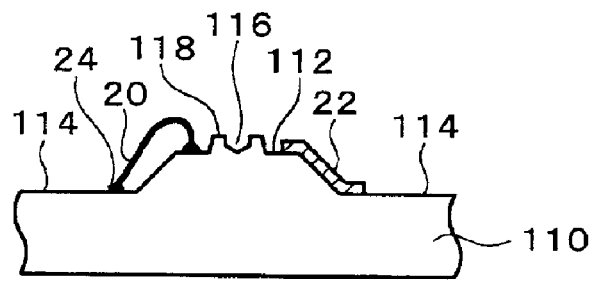
FIG. 13 shows a method of manufacturing a platform according to a second embodiment of the present invention.

FIGS. 13 to 16 show a second embodiment of the method of manufacture of a platform according to the present invention. In this embodiment, a mold 110 shown in FIG. 13 is used.

The mold 110 has on its surface at least one (in FIG. 13 one of a plurality is shown) first region 112 and second region 114. In the first region 112, a projected portion 118 is formed, having a hole 116 formed in its upper surface.

The projected portion 118 is formed of a size to leave remaining a region of the first region 112 to contact the interconnecting lines 20 and 22. The upper surface of the projected portion 118 may be flat, or may have a relief texture, or be a rough surface.

The hole 116, like the hole 16 shown in FIG. 1, serves to have a pin 32 (description of a pin 34 is omitted) with its end inserted. The hole 116 is preferably shallower than the height of the first region 112. In more detail, the depth of the hole 116 is preferably made such that when the end of the pin 32 is inserted in the hole 116, its end surface is positioned above the surface of the first region 112.

In other aspects of the construction of the mold 110, the description of the mold 10 shown in FIG. 1 applies.

In this embodiment, as shown in FIG. 13, the mold 110 is provided with interconnecting lines 20 and 22. The details thereof are the same as in the first embodiment, and description is therefore omitted here.

Figure 14:
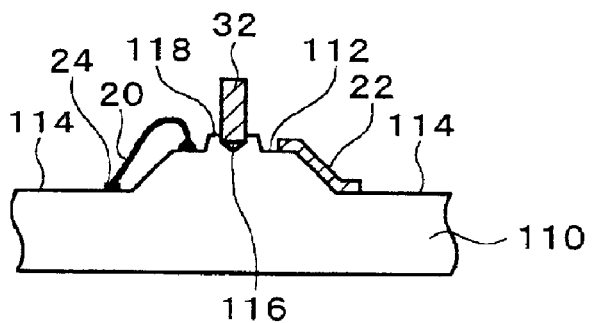
FIG. 14 shows a method of manufacturing a platform according to the second embodiment of the present invention.

Next, as shown in FIG. 14, the pin 32 is disposed with its end facing the mold 110. The details thereof are the same as in the first embodiment, and description is therefore omitted here.

Figure 15:
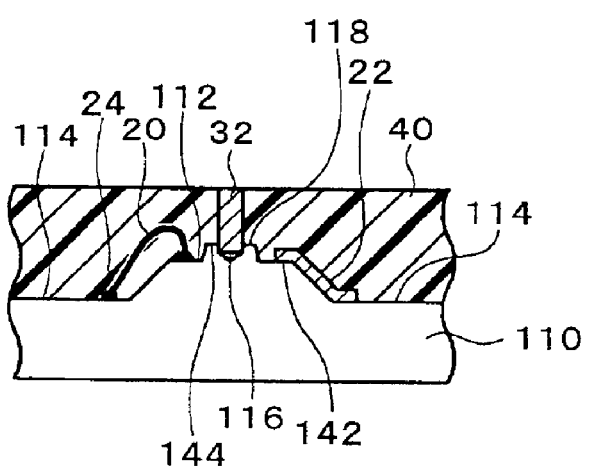
FIG. 15 shows a method of manufacturing a platform according to the second embodiment of the present invention.

Then, as shown in FIG. 15, the interconnecting lines 20 and 22 and pin 32 are sealed with the molding material 40. The details thereof are the same as in the first embodiment, and description is therefore omitted here.

In this embodiment, in the first region 112 the projected portion 118 is formed, and therefore in the molding material 40 a recess 144 is formed. In more detail, in the molding material 40 an indent 142 is formed, and within the indent 142 the recess 144 is formed.

Figure 16:
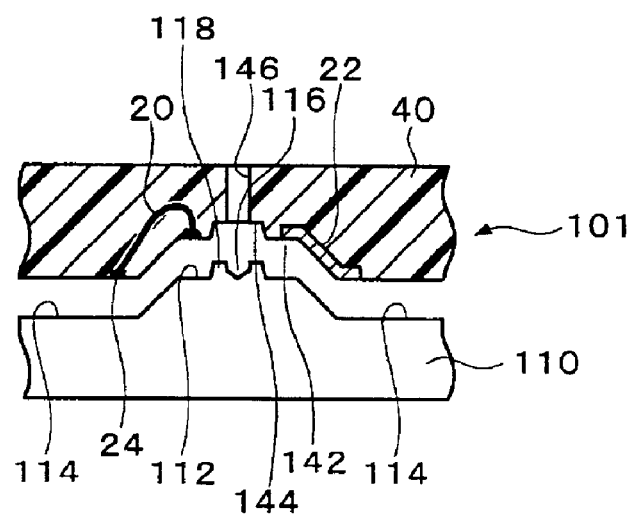
FIG. 16 shows a method of manufacturing a platform according to the second embodiment of the present invention.

Next, as shown in FIG. 16, the molding material 40 is cured, the pin 32 is removed from the molding material 40 to form a through hole 146, and the molding material 40 is released from the mold 110. If required, the molding material 40 is cut. Thus, a platform 101 is obtained. The platform 101 has a formed body formed from the molding material (for example resin) 40. In the formed body, the indent 142 is formed.

Figure 17:
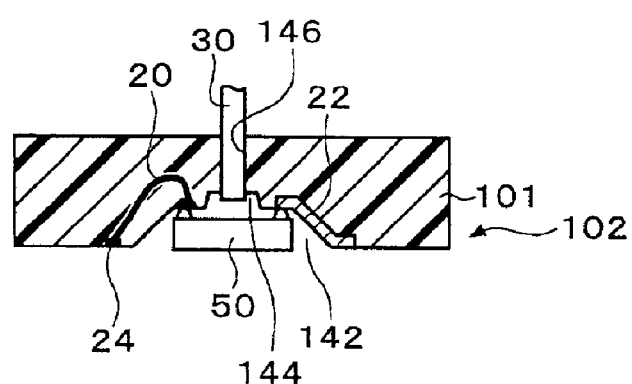
FIG. 17 shows a method of manufacturing an optical module according to the second embodiment of the present invention.

Then, as shown in FIG. 17, the optical fiber 30 is inserted in the through hole 146. The end surface of the optical fiber 30 is arranged not to project from the bottom surface of the indent 142. In other aspects of the construction, the description of the first embodiment applies.

The optical fiber 30 is fixed within the recess 144. The end surface of the optical fiber 30 preferably does not project from the bottom surface of the indent 142 (the surface formed by the first region 112 of the mold 110). By means of this, contact with the optical part of the optical element 50 by the end of the optical fiber 30 is avoided. For this purpose, as shown in FIG. 14, the form of the hole 116 is such that when the pin 32 is inserted in the hole 116 of the mold 110, the end surface of the pin 32 is not deeper than the surface of the first region 112. In other details, the description of the first embodiment applies.

The optical element 50 is mounted on the platform 101, and an optical module 102 is obtained. Other details are as described in the first embodiment. The end of the optical fiber 30 does not project from the surface of the platform 101 on which the optical element 50 is mounted, and therefore the optical fiber 30 does not touch the optical part of the optical element 50.

Figure 18:
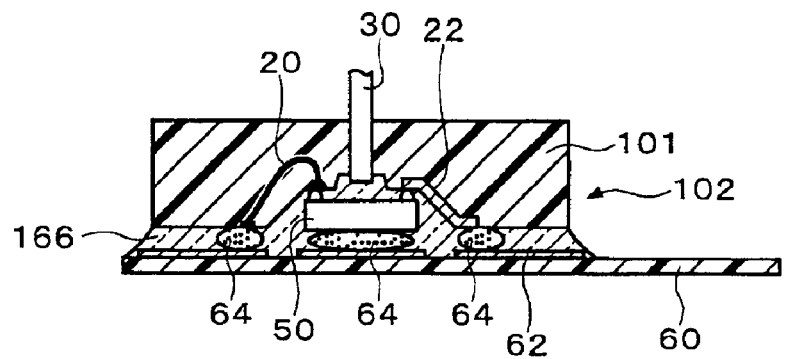
FIG. 18 shows a method of manufacturing an optical module according to the second embodiment of the present invention.

As shown in FIG. 18, the optical module 102 maybe attached to a substrate 60. A resin 166 for sealing the optical element 50 is preferably provided. In the example shown in FIG. 18, the resin 166 is provided between the substrate 60 and the optical module 102, and is thus an underfill. Since a cavity (the recess 144) is formed between the optical part (not shown in the drawings) of the optical element 50 and the end surface of the optical fiber 30, at least in the portion with which this gap is filled, the resin 166 is a transparent resin. In other details, the description of the first embodiment applies.

Figure 19:
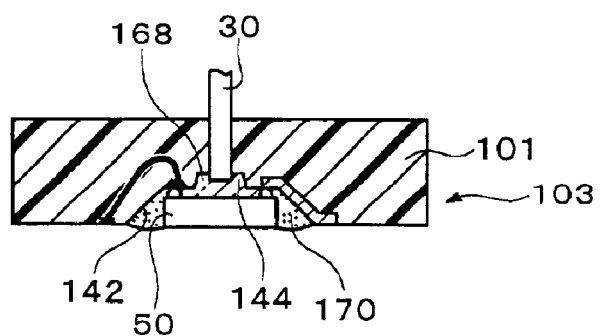
FIG. 19 shows a method of manufacturing an optical module according to the second embodiment of the present invention.

FIG. 19 shows a different example of an optical module 103. The optical module 103 has the indent 142 formed in the platform 101 filled with resin 168, 170. Since a cavity (the recess 144) is formed between the optical part (not shown in the drawings) of the optical element 50 and the end surface of the optical fiber 30, at least the resin 168 with which this gap is filled is a transparent resin, and the resin 170 with which the remaining region (the indent 142) is filled may be a resin not transmitting light.

Figure 20:
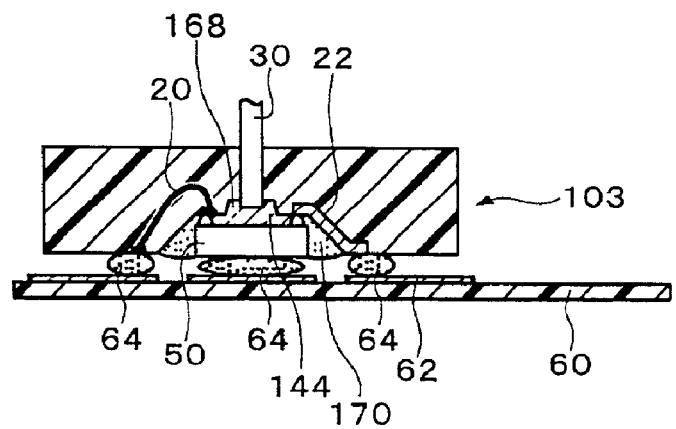
FIG. 20 shows a method of manufacturing an optical module according to the second embodiment of the present invention.

The optical module 103 shown in FIG. 19, as shown in FIG. 20, may be mounted on the substrate 60. Other details are as described in the first embodiment.

As described above, according to this embodiment, the optical fiber 30 does not project from the bottom surface of the indent 142, which is the surface of the platform 101 on which the optical element 50 is mounted. Therefore, the optical fiber 30 can be prevented from contacting the optical part of the optical element 50. Other resultant effects are as described in the first embodiment.

Third Embodiment

Figure 21:
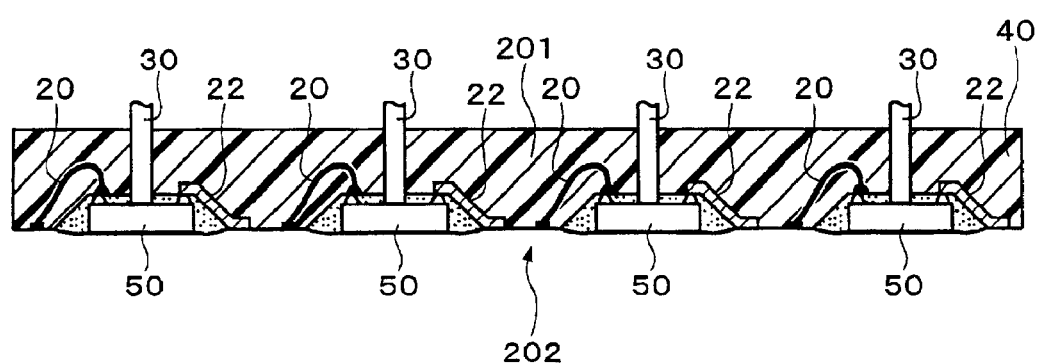
FIG. 21 shows a method of manufacturing an optical module according to a third embodiment of the present invention.

FIG. 21 shows a third embodiment of the optical module of the present invention. This optical module 202 includes a platform 210, a plurality of optical elements 50, and a plurality of optical fibers 30. Each optical fiber 30 is provided with a corresponding optical element 50. A platform 201 is formed by integration of a plurality of the platforms 1 described in the first embodiment.

The optical module 202 shown in FIG. 21 has four optical elements 50, and when used for transmission of a color image signal, the optical elements 50 and optical fibers 30 are used for transmitting and receiving red, green, and blue signals and a clock signal.

The optical module 202 of this embodiment can be manufactured by cutting the molding material 40 at positions such as to include the mounting regions of a plurality of optical elements 50.

Fourth Embodiment

Figure 22:
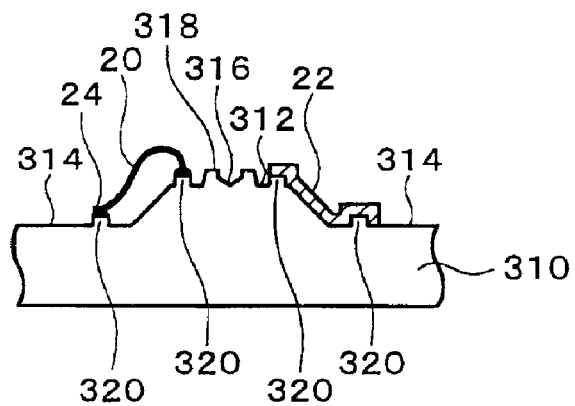
FIG. 22 shows a method of manufacturing a platform according to a fourth embodiment of the present invention.

FIGS. 22 to 25 show a fourth embodiment of the method of manufacture of a platform according to the present invention. In this embodiment, a mold 310 shown in FIG. 22 is used.

The mold 310 has on its surface at least one (in FIG. 22 one of a plurality is shown) first region 312 and second region 314. In the first region 312 is formed a projected portion 318 in the upper surface of which a hole 316 is formed. The projected portion 318 and hole 316 have the same construction as the projected portion 118 and hole 116 shown in FIG. 13.

The mold 310 has a projection 320. The projection 320 is formed in at least one of the first and second regions 312 and 314 (both in FIG. 22). The projection 320 is adhered to the upper surface of the interconnecting lines 20 and 22. By means of the projection 320, a recess 346 (see FIG. 25) is formed in the molding material 40 exposing the interconnecting lines 20 and 22 to the bottom surface.

In other aspects of the construction of the mold 310, the description of the mold 10 shown in FIG. 1 applies.

In this embodiment, as shown in FIG. 22, the mold 310 is provided with interconnecting lines 20 and 22. In more detail, the interconnecting lines 20 and 22 are partially adhered to the projection 320 (for example the upper surface thereof). When a wire is bonded to the projection 320, a bonding pad 24 is first formed on the projection 320. Other details are the same as in the first embodiment, and description is therefore omitted here.

Figure 23:
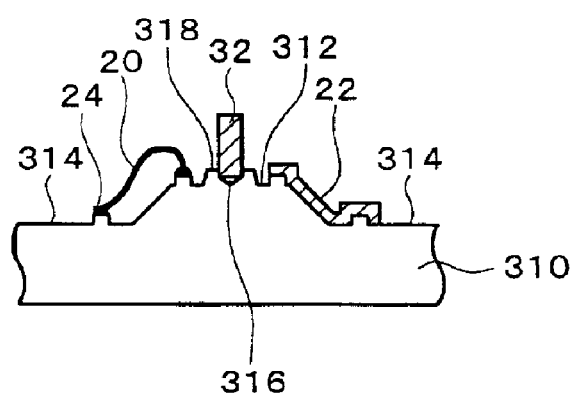
FIG. 23 shows a method of manufacturing a platform according to the fourth embodiment of the present invention.

Next, as shown in FIG. 23, the pin 32 (description of a pin 34 is omitted) is disposed with its end facing the mold 310. The details thereof are the same as in the embodiment shown in FIG. 14, and description is therefore omitted here.

Figure 24:
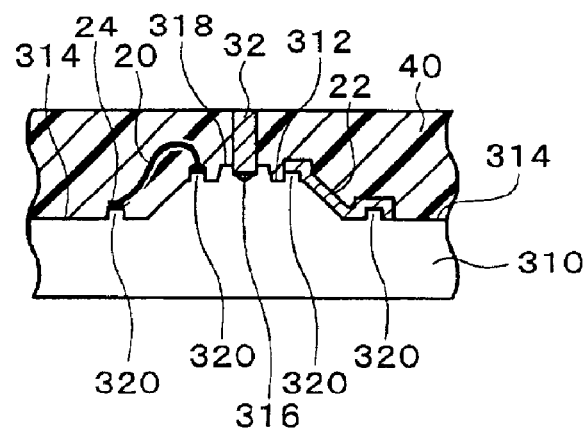
FIG. 24 shows a method of manufacturing a platform according to the fourth embodiment of the present invention.

Then as shown in FIG. 24, the interconnecting lines 20 and 22 and pin 32 are sealed with the molding material 40. The details thereof are the same as in the embodiment shown in FIG. 15, and description is therefore omitted here.

Figure 25:
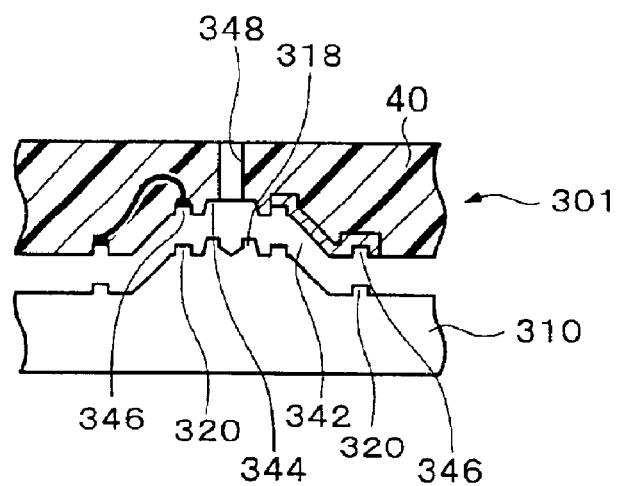
FIG. 25 shows a method of manufacturing a platform according to the fourth embodiment of the present invention.

Next, as shown in FIG. 25, the molding material 40 is cured, the pin 32 is removed from the molding material 40 to form a through hole 348, and the molding material 40 is released from the mold 310. If required, the molding material 40 is cut. Thus, a platform 301 is obtained. The platform 301 has a formed body formed from the molding material (for example resin) 40. In the formed body, an indent 342 is formed.

In the platform 301, the recess 346 is formed so that a part of the interconnecting lines 20 and 22 is exposed in the inner surface (lateral or bottom surface). The recess 346 is formed by the projection 320 of the mold 310. In other aspects of the construction the description of the second embodiment applies.

Figure 26:
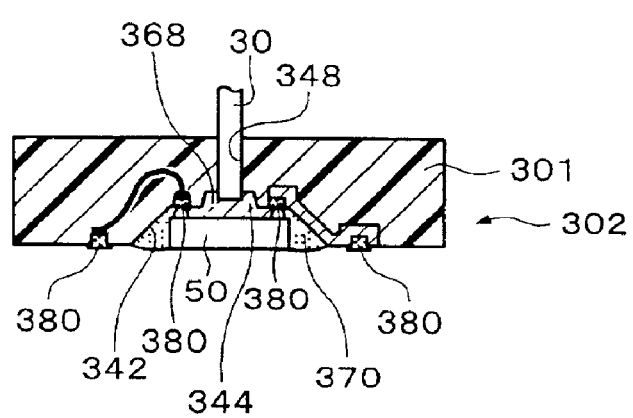
FIG. 26 shows a method of manufacturing an optical module according to the fourth embodiment of the present invention.

Then as shown in FIG. 26, the optical fiber 30 is inserted in the through hole 348. The end of the optical fiber 30 projects into a recess 344 formed in the bottom surface of the indent 342, but the end surface of the optical fiber 30 does not project from the bottom surface of the indent 342.

Next, the optical element 50 is mounted on the platform 301, and an optical module 302 is obtained. The optical module 302 is formed by filling the indent 342 formed in the platform 301 with resin 368, 370. Since a cavity (the recess 344) is formed between the optical part (not shown in the drawings) of the optical element 50 and the end surface of the optical fiber 30, at least the resin 368 with which this gap is filled is a transparent resin, but the resin 370 with which the remaining region (indent 342) is filled may be a resin not transmitting light.

The recess 346 on the inner surface of which the interconnecting lines 20 and 22 are exposed may, as shown in FIG. 26, be filled with a conductive material 380. In this state, a part of the interconnecting lines 20 and 22 is not exposed, but forms a part of the inner surface of the recess 346. The conductive material 380 maybe a brazing material such as solder or the like, or may be a conductive paste. In the example shown in FIG. 26, the electrode (bump) of the optical element 50 is bonded to the conductive material 380 with which the recess 346 formed within the indent 342 is filled.

Figure 27:
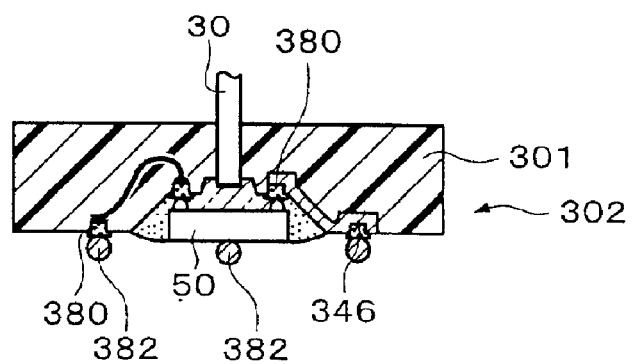
FIG. 27 shows a method of manufacturing an optical module according to the fourth embodiment of the present invention.

As shown in FIG. 27, for the purposes of external electrical connection, the optical module 302 may be provided with external terminal 382 in the form of solder balls or the like. For example, as shown in FIG. 27, on an electrode (not shown in the drawings) formed on the opposite side of the optical element 50 from the optical fiber 30, an external terminal 382 is provided. Around the indent 342, an external terminal 382 is provided on the conductive material 380 with which the recess 346 formed in the platform 301 is filled. As described in the first embodiment, the optical module 302 may be mounted on a substrate.

As described above, according to this embodiment, in addition to the effect described for the second embodiment, since the recess 346 is filled with the conductive material 380, electrical connection is more easily achieved.

Fifth Embodiment

Figure 28:
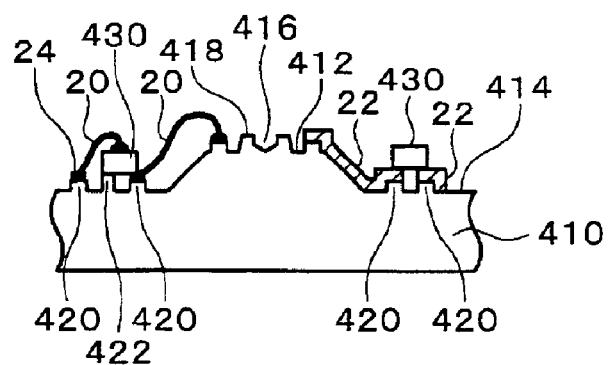
FIG. 28 shows a method of manufacturing a platform according to a fifth embodiment of the present invention.

FIGS. 28 to 31 show a fifth embodiment of the method of manufacture of a platform according to the present invention. In this embodiment, a mold 410 shown in FIG. 28 is used.

The mold 410 has on its surface at least one (in FIG. 28 one of a plurality is shown) first region 412 and second region 414. In the first region 412, a projected portion 418 with a hole 416 formed in the upper surface is formed. The projected portion 418 and hole 416 have the same construction as the projected portion 118 and hole 116 shown in FIG. 13.

The mold 310 has a projection 420. The projection 420 is formed in at least one of the first and second regions 412 and 414 (both in FIG. 28). The interconnecting lines 20 and 22 are adhered to a surface (for example a top surface) of the projection 420. By means of the projection 420, a recess 446 (see FIG. 31) is formed in the molding material 40, so that the interconnecting lines 20 and 22 are exposed in the inner surface (bottom surface or side surface). A projection 422 not for making the interconnecting lines 20 and 22 adhered to but for supporting an electronic component may be formed.

In other aspects of the construction of the mold 410, the description of the mold 10 shown in FIG. 1 applies. In this embodiment, as shown in FIG. 28, the mold 410 is provided with interconnecting lines 20 and 22. Other details are as described in the fourth embodiment.

Furthermore, an electronic component 430 is mounted on the mold 410. The electronic component 430 is electrically connected to the interconnecting lines 20 and 22. For example, the electronic component 430 may be mounted on the interconnecting lines 20 and 22 adhered to the projection 420, or the interconnecting line 20 may be bonded to the electronic component 430. As examples of the electronic component 430 may be cited a resistor, a capacitor, a coil, an oscillator, a filter, a temperature sensor, a thermistor, a varistor, a variable resistor, a fuse, a Peltier element, or a heat pipe or similar component for cooling.

Figure 29:
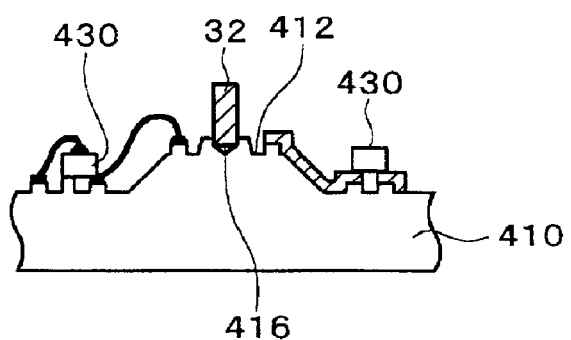
FIG. 29 shows a method of manufacturing a platform according to the fifth embodiment of the present invention.

Next, as shown in FIG. 29, the pin 32 (description of a pin 34 is omitted) is disposed with its end facing the mold 410. The details thereof are the same as in the embodiment shown in FIG. 14, and description is therefore omitted here.

Figure 30:
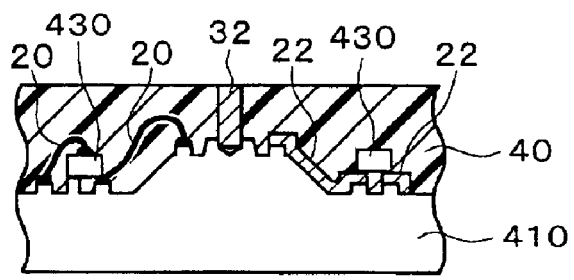
FIG. 30 shows a method of manufacturing a platform according to the fifth embodiment of the present invention.

Then as shown in FIG. 30, the interconnecting lines 20 and 22, pin 32 and electronic component 430 are sealed with the molding material 40. The details thereof are the same as in the embodiment shown in FIG. 15, and description is therefore omitted here.

Figure 31:
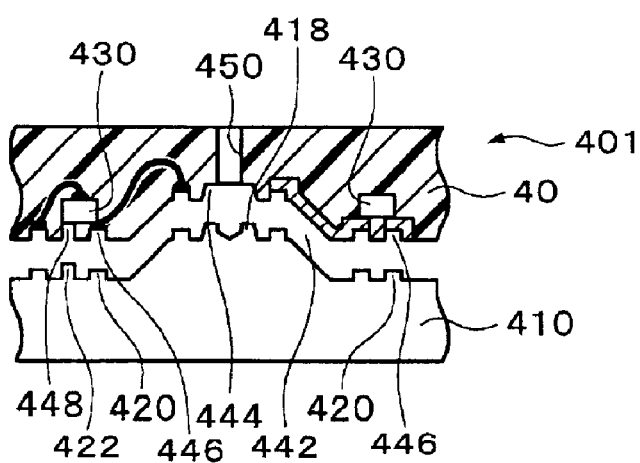
FIG. 31 shows a method of manufacturing a platform according to the fifth embodiment of the present invention.

Next, as shown in FIG. 31, the molding material 40 is cured, the pin 32 is removed from the molding material 40 to form a through hole 450, and the molding material 40 is released from the mold 410. If required, the molding material 40 is cut. In more detail, the description of the second embodiment applies.

In this way, a platform 401 is obtained. The platform 401 has a formed body formed from the molding material (for example resin) 40. In the formed body, an indent 442 is formed.

In the platform 401, a recess 446 is formed so that a part of the interconnecting lines 20 and 22 is exposed in the inner surface (lateral or bottom surface). The recess 446 is formed by the projection 420 of the mold 410. In the platform 401 a recess 448 is formed by the projection 422 for supporting the electronic component 430. If an electrode of the electronic component 430 is mounted on the projection 422, within the recess 448 the electrode of the electronic component 430 will be exposed within the recess 448. In other aspects of the construction the description of the second embodiment applies.

Figure 32:
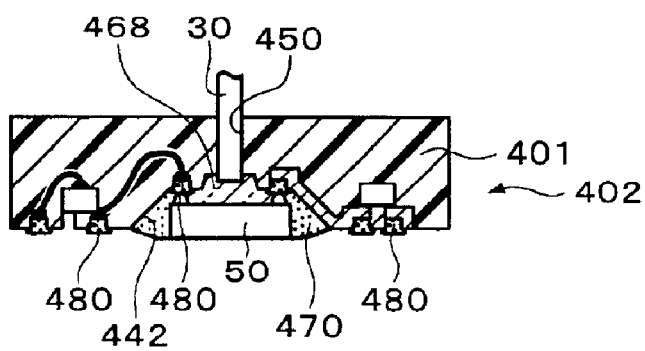
FIG. 32 shows a method of manufacturing an optical module according to the fifth embodiment of the present invention.

As shown in FIG. 32, the optical fiber 30 is inserted in the through hole 450. The end of the optical fiber 30 projects within a recess 444, but does not project from the bottom surface of the indent 442.

As shown in FIG. 32, the optical element 50 is mounted on the platform 401, and an optical module 402 is obtained. The optical module 402 is formed by filling the indent 442 formed in the platform 401 with resin 468, 470. Other details are as described in the fourth embodiment.

The recess 446 may, as shown in FIG. 32, be filled with a conductive material 480. Other details are as described in the fourth embodiment. It should be noted that the recess 448 may also be filled with the conductive material 480.

Figure 33:
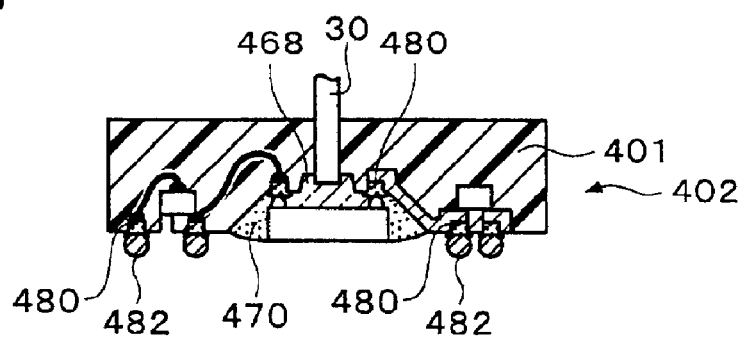
FIG. 33 shows a method of manufacturing an optical module according to the fifth embodiment of the present invention.

As shown in FIG. 33, for the purposes of external electrical connection, the optical module 402 may be provided with external terminals 482 in the form of solder balls or the like. Other details are as described in the fourth embodiment. The optical module 402 may, as described in the first embodiment, be mounted on a substrate.

As described above, according to this embodiment, in addition to the effect described for the second embodiment, since the recess 446 is filled with the conductive material 480, electrical connection is more easily achieved. The platform 401 of this embodiment has the electronic component 430 incorporated, and the electronic component 430 is sealed in the formed body itself, as a result of which stabilized quality can be achieved.

Sixth Embodiment

Figure 34:
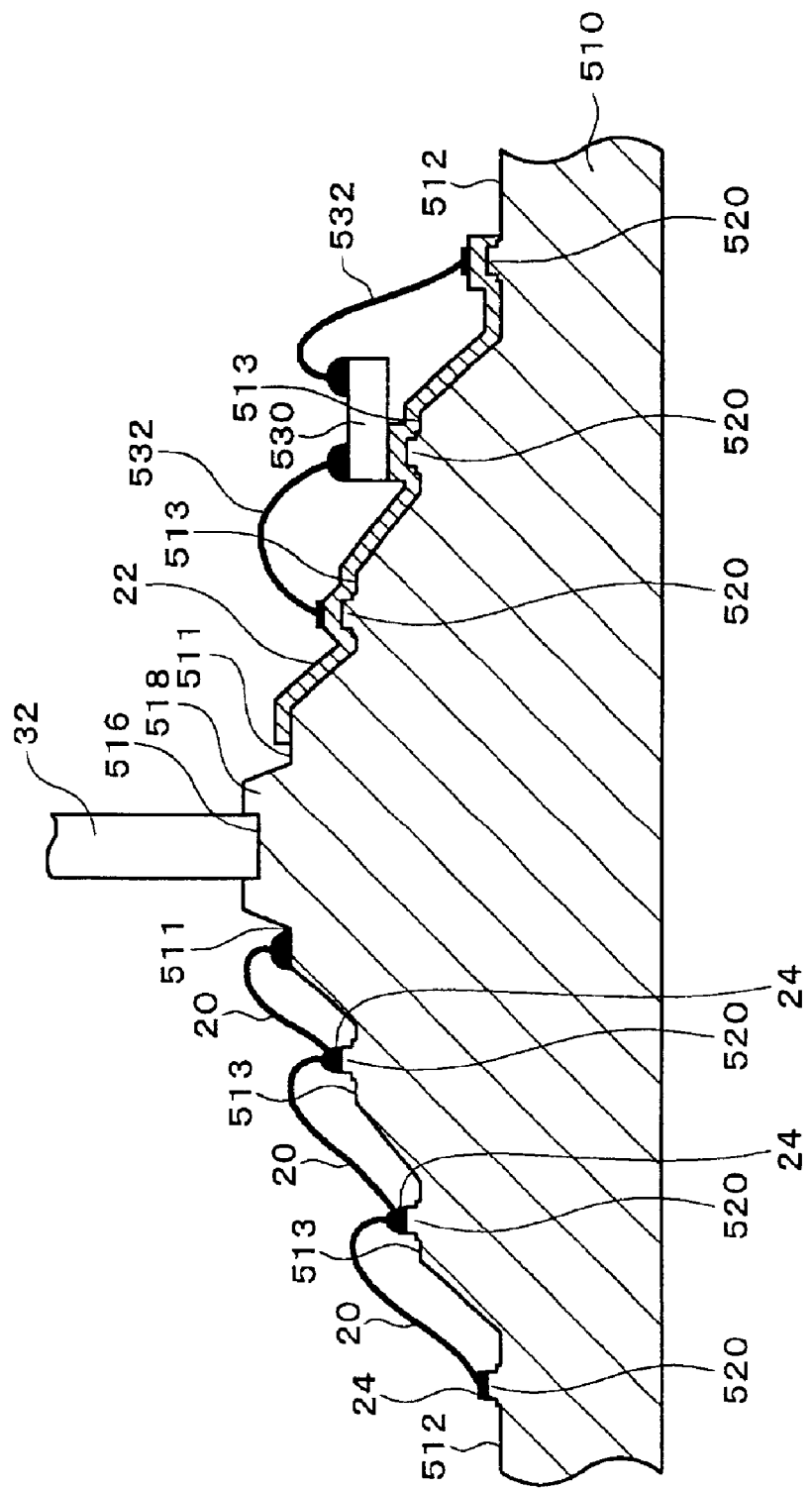
FIG. 34 shows a method of manufacturing a platform according to a sixth embodiment of the present invention.
Figure 35:
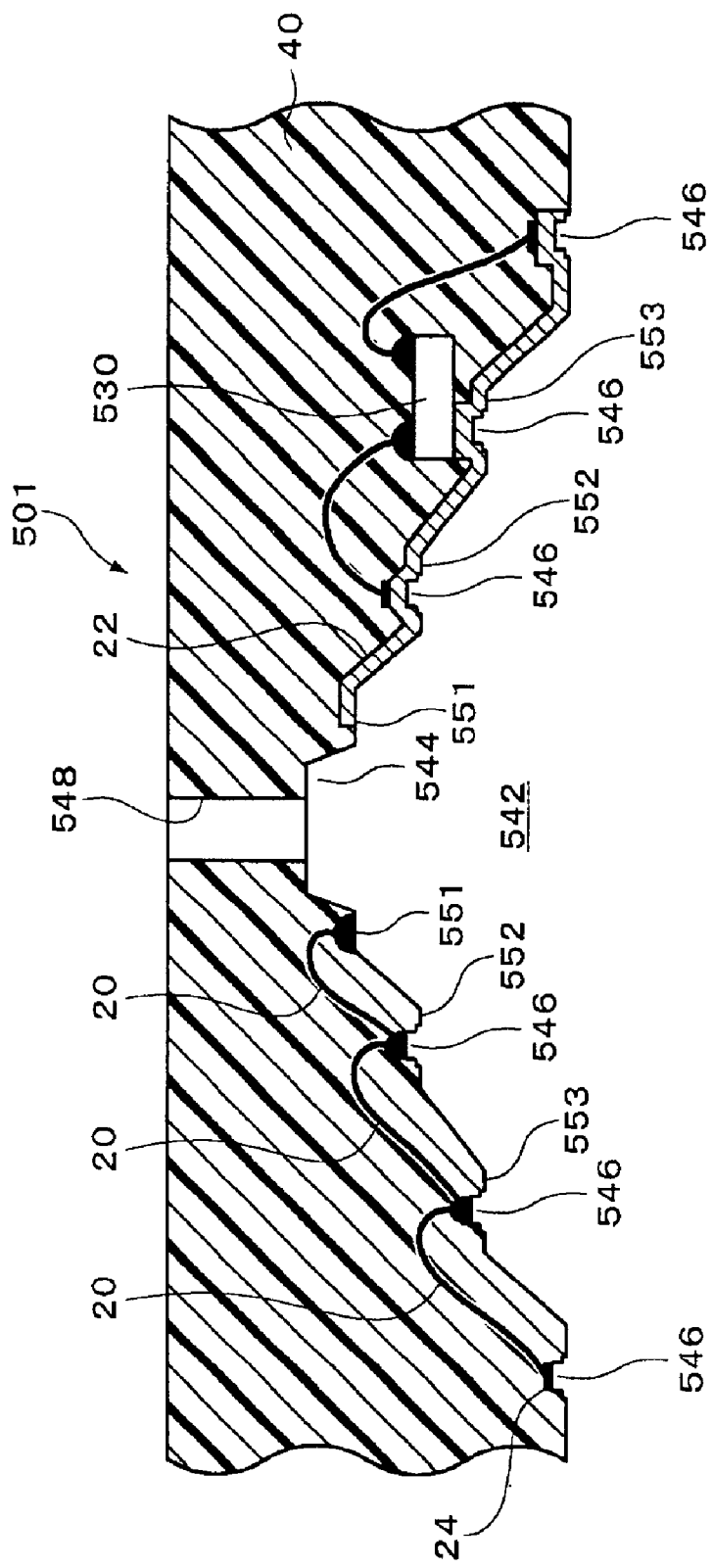
FIG. 35 shows a method of manufacturing a platform according to the sixth embodiment of the present invention.

FIGS. 34 to 35 show a sixth embodiment of the method of manufacture of a platform according to the present invention. In this embodiment, a mold 510 shown in FIG. 34 is used.

The mold 510 has a peaked form, with a plurality of stepped levels, and in plan view, may be circular or rectangular. The mold 510 has a first region 511, a second region 512 positioned lower than the first region 511, and positioned between the heights of the first and second regions 511 and 512 at least one (in FIG. 34, a plurality) stepped third region 513. In FIG. 34, a single first region 511 is shown, but the mold 510 may have a plurality of first regions 511.

In the first region 511, a projected portion 518 having a hole 516 formed in the upper surface is formed. The projected portion 518 and hole 516 have the same construction as the projected portion 118 and hole 116 shown in FIG. 13.

The mold 510 has a projection 520. The projection 520 shown in FIG. 34 is formed in the second and third regions 512 and 513, but may be formed in either one only, or may be formed in the first region 511. The interconnecting lines 20 and 22 are adhered to a surface (for example a top surface) of the projection 520. By means of the projection 520, concavities 546 (see FIG. 35) are formed in the molding material 40, with the interconnecting lines 20 and 22 exposed on the inner surface (bottom surface or side surface).

In other aspects of the construction of the mold 510, the description of the mold 10 shown in FIG. 1 applies. In this embodiment, as shown in FIG. 34, the mold 510 is provided with interconnecting lines 20 and 22.

For example, a part (for example, one end) of each of the interconnecting lines 20 is adhered to the first or second region 511 or 512, and another part (for example, the other end) is adhered to the third region 513. Or both ends of some interconnecting line 20 are adhered to the third region 513 in a plurality of steps. Alternatively, skipping the third region 513, the interconnecting line 20 may be adhered to the first and second regions 511 and 512. It should be noted that before adhereing the interconnecting line 20 contact, as described in the first embodiment, a bonding pad 24 may be formed. Over an interconnecting line 20 adhered to the mold 510, another interconnecting line 20 may be adhered.

Similarly, an interconnecting line 22 is provided, having a part adhered to the first, second and third regions 511, 512, and 513. In the example shown in FIG. 34, an interconnecting line 22 is formed continuously in the first, second and third regions 511, 512, and 513. As an example differing from this, an interconnecting line 22 may be formed between the first and third regions 511 and 513 only, or between the third and second regions 513 and 512 only.

Furthermore, an electronic component 530 may be mounted on the mold 510. The electronic component 530 is electrically connected to the interconnecting lines 20 and 22. For example, the electronic component 530 is mounted on a interconnecting line 22 adhered to the projection 520. If required, electrodes of the electronic component 530 and interconnecting lines 20 and 22 may be electrically connected by a wire 532 or the like. Other details are as described in the fifth embodiment.

Next, the pin 32 (description of a pin 34 is omitted) is disposed with its end facing the mold 510. The details thereof are the same as in the embodiment shown in FIG. 14, and description is therefore omitted here.

The interconnecting lines 20 and 22, pin 32, and electronic component 530 are sealed with the molding material 40. Then the molding material 40 is cured, the pin 32 is removed from the molding material 40 to form a through hole 548, and the molding material 40 is released from the mold 510. If necessary, the molding material 40 is cut. Thus, the platform 501 shown in FIG. 35 is formed. The details thereof are the same as in the embodiment shown in FIGS. 15 to 16, and description is therefore omitted here.

The platform 501 has a formed body formed from the molding material (for example resin) 40. In the formed body, an indent 542 is formed. Within the indent 542, steps are formed by a plurality of bottom surfaces 551 to 553. In the deepest bottom surface 551, a recess 544 is formed.

In the bottom surfaces 551 to 553 of the indent 542, a part of the interconnecting lines 20 and 22 is exposed. In the deepest bottom surface 551, the interconnecting lines 20 and 22 are exposed flush with the bottom surface 551. In the bottom surfaces 552 and 553 other than the deepest bottom surface 551, concavities 546 are formed so that a part of the interconnecting lines 20 and 22 is exposed in the inner surface (lateral or bottom surface). The concavities 546 are formed by the projections 520 of the mold 510. The concavities 546 are formed on the periphery of the indent 542, which is the surface of the platform 501.

Figure 36:
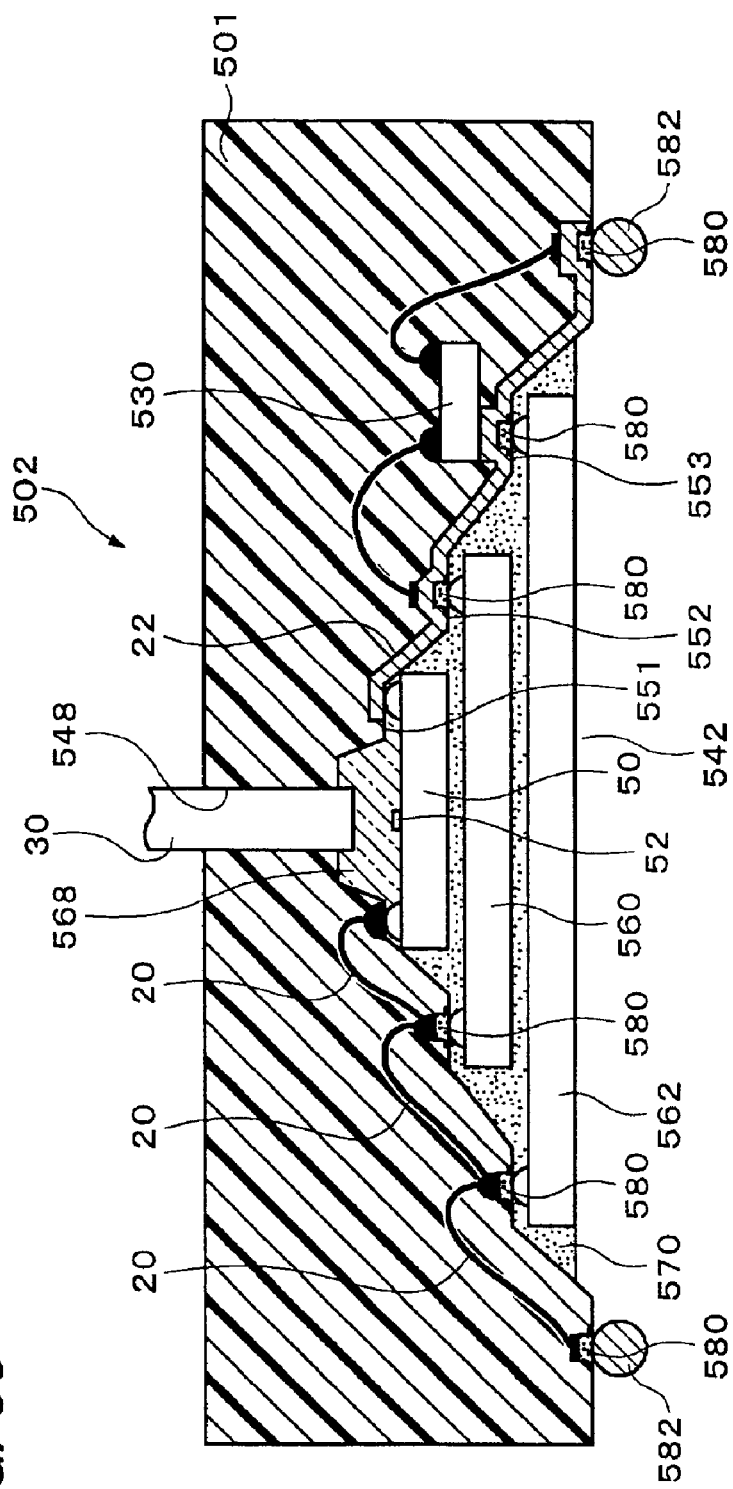
FIG. 36 shows a method of manufacturing an optical module according to the sixth embodiment of the present invention.

The concavities 546 may, as shown in FIG. 36, be filled with a conductive material 580. Other details are as described in the fourth embodiment.

Next, as shown in FIG. 36, the optical fiber 30 is inserted in the through hole 548 in the platform 501. The end of the optical fiber 30 projects into the recess 544, but the end surface of the optical fiber 30 is such as not to project from the deepest bottom surface 551.

The optical element 50 is mounted on the platform 501. In more detail, with an optical part 52 facing the end surface of the optical fiber 30, the optical element 50 is mounted on the deepest bottom surface 551 of the indent 542. The part of the interconnecting lines 20 and 22 exposed on the bottom surface 551 and the electrodes (bumps) of the optical element 50 are electrically connected. For example, facedown bonding is applied. Between the optical element 50 and the optical fiber 30 is filled with a resin 568. In particular, between the end surface of the optical fiber 30 and the optical part 52 of the optical element 50, the resin 568 is light-transmitting (transparent).

Following on from this, semiconductor chips 560 and 562 are mounted within the indent 542 in positions shallower than the optical element 50. The semiconductor chips 560 and 562 are driver devices for the optical element 50. The semiconductor chips 560 and 562 incorporate circuits for driving the optical element 50. On the semiconductor chips 560 and 562, a plurality of electrodes (or pads) electrically connected to the internal circuitry are formed. It should be noted that in place of the semiconductor chips, a chip formed without the use of semiconductors incorporating the circuits may be applied, and the same effect can be achieved.

The semiconductor chips 560 and 562 are mounted on the bottom surfaces 552 and 553 other than the deepest bottom surface 551. The bottom surfaces 552 and 553 are formed by the third region 513 of the mold 510. The part of the interconnecting lines 20 and 22 exposed in the bottom surfaces 552 and 553 and the electrodes (bumps) of the semiconductor chip 560 are electrically connected. The interconnecting lines 20 and 22 are exposed within the concavities 546 (see FIG. 35) formed in the bottom surfaces 552 and 553. Alternatively, a part of the interconnecting lines 20 and 22 forms a part of the inner wall of the concavities 546 formed in the bottom surfaces 552 and 553 (see FIG. 35).

The optical element 50 and semiconductor chips 560 and 562 are sealed by a resin 570. That is to say, the indent 542 is filled with the resin 570. If the gap between the optical part 52 of the optical element 50 and the end surface of the optical fiber 30 is filled with the transparent resin 568, the resin 570 need not be light-transmitting.

In this way, an optical module 502 is obtained. For the purposes of external electrical connection, the optical module 502 may be provided with external terminals 582 in the form of solder balls or the like. Other details are as described in the fourth embodiment. The optical module 502 may, as described in the first embodiment, be mounted on a substrate.

As described above, according to this embodiment, in addition to the effect described for the other embodiments, the semiconductor chips 560 and 562 can be incorporated in the optical module 502 in a compact way.

Seventh Embodiment

Figure 37:
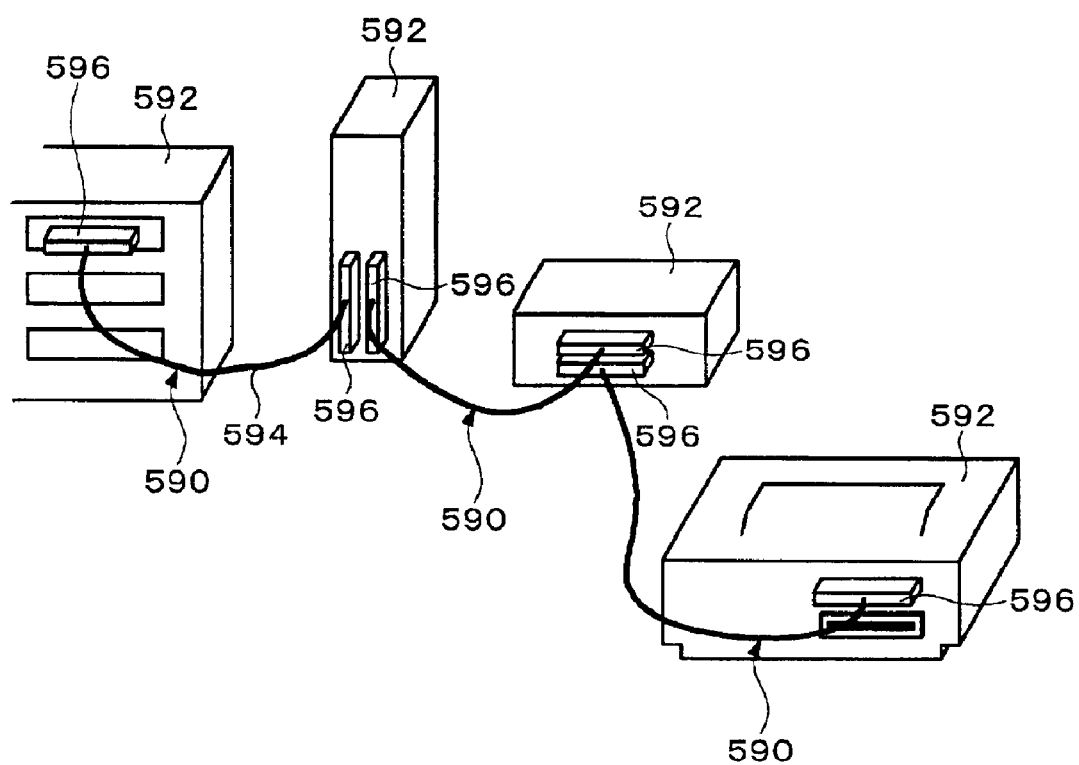
FIG. 37 shows an optical transmission device according to a seventh embodiment of the present invention.

FIG. 37 shows a seventh embodiment of the optical transmission device of the present invention. The optical transmission device 590 connects together electronic instruments 592, such as computers, displays, storage devices, printers, and the like. The electronic instruments 592 may be data communications devices. The optical transmission device 590 may have a cable 594 with a plug 596 provided at each end. The cable 594 includes one or a plurality of (at least one) optical fibers 30 (see FIG. 8). The plug 596 may incorporate a semiconductor chip.

The optical element 50 connected to one end of the optical fiber 30 is a light-emitting element. The electrical signal output by one electronic instrument 592 is converted to an optical signal by the optical element 50 which is a light-emitting element. The optical signal is transmitted by the optical fiber 30, and input to the other optical element 50. This optical element 50 is a light-receiving element, and converts the input optical signal into an electrical signal. Then the electrical signal is input to the other electronic instrument 592. Thus, by means of the optical transmission device 590 of this embodiment, information can be transferred between the electronic instruments 592 by optical signals.

Eighth Embodiment

Figure 38:
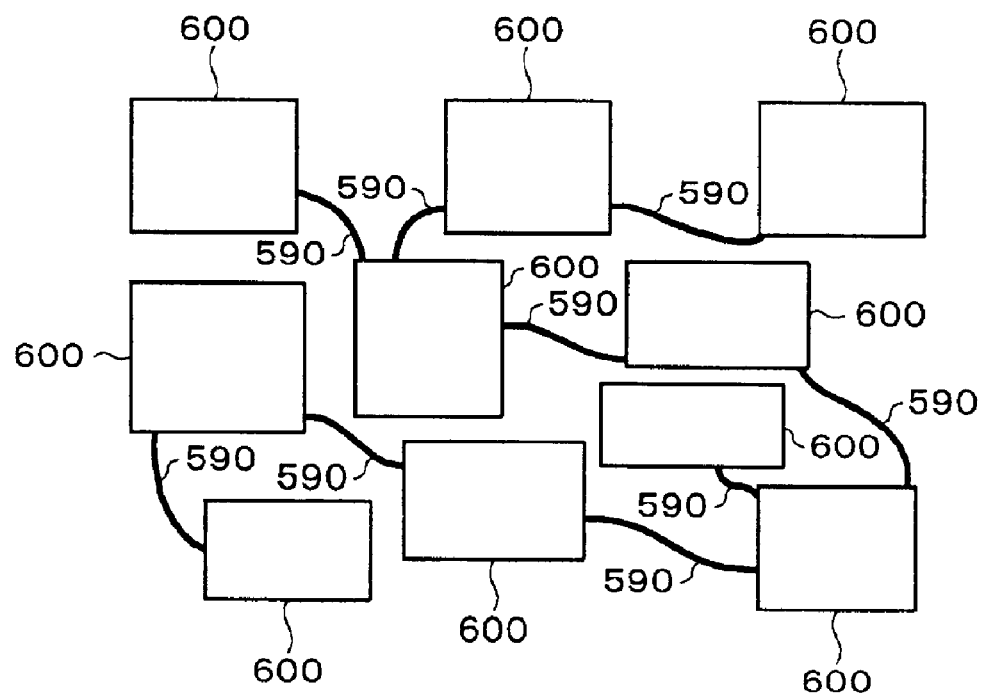
FIG. 38 shows an optical transmission device according to an eighth embodiment of the present invention.

FIG. 38 shows an example of the use of an eighth embodiment of the optical transmission device of the present invention. The optical transmission device 590 connects electronic instruments 600. As the electronic instrument 600 may be cited: liquid crystal display monitor or CRTs with digital support (These may be used in the financial, direct marketing, medical, and educational fields.), liquid crystal projectors, plasma display panels (PDP), digital TVs, retail cash registers (for POS (Point of Sale Scanning)), videos, tuners, games consoles, printers, and the like.

What is claimed is:

1. A method of manufacturing a platform, comprising the steps of: providing a mold having first and second regions with an interconnecting line adhered to the first or second region;

disposing a pin with a tip of the pin facing the mold;

sealing the interconnecting line and the pin with a molding material;

removing the pin from the molding material to form a through hole in the molding material; and releasing the interconnecting line and the molding material from the mold.

2. The method of manufacturing a platform as defined in claim 1, wherein:

the interconnecting line is a wire; and both ends of the wire are bonded to the first and second regions.

3. The method of manufacturing a platform as defined in claim 2, wherein:

bonding pads are previously provided; and both ends of the wire are bonded to the bonding pads.

4. The method of manufacturing a platform as defined in claim 1, wherein:

the interconnecting line is a conductive layer; and the conductive layer is formed over the first and second regions.

5. The method of manufacturing a platform as defined in claim 1, wherein a mold release agent is applied to at least one of the mold and the pin when the interconnecting line and the pin are sealed by the molding material.

6. The method of manufacturing a platform as defined in claim 1, wherein the end of the pin is inserted into a hole formed in the mold.

7. The method of manufacturing a platform as defined in claim 6, wherein:

the first region of the mold is formed to be substantially planar; and the hole is formed in the first region.

8. The method of manufacturing a platform as defined in claim 6, wherein:

the mold has a projected portion within the first region; and the hole is formed in a top surface of the projected portion.

9. The method of manufacturing a platform as defined in claim 1, wherein the first region of the mold projects further than the second region to form an indent in the molding material.

10. The method of manufacturing a platform as defined in claim 1, wherein:

the mold has a projection;

the interconnecting line is adhered to a region of the projection; and the projection forms a recess in the molding material.

11. The method of manufacturing a platform as defined in claim 10, further comprising:

a step of filling the recess with a conductive material.

12. The method of manufacturing a platform as defined in claim 1, wherein:

an electronic component is electrically connected to the interconnecting line and mounted over the mold; and the molding material seals the electronic component together with the interconnecting line.

13. The method of manufacturing a platform as defined in claim 1, wherein:

the mold includes the first region, the second region provided in a position lower than the first region, and a third region provided between the first and the second regions; and the interconnecting line is adhered to the first or second region and also to the third region in the step of providing the interconnecting line.

14. The method of manufacturing a platform as defined in claim 1, wherein:
the mold has a plurality of the first and second regions;
a plurality of the pins are disposed with tips of the pins facing the mold; and
the plurality of pins are removed from the molding material to form a plurality of the through holes in the molding material.

15. The method of manufacturing a platform as defined in claim 14, further comprising:
a step of cutting the molding material.

16. A method of manufacturing an optical module comprising the steps of:
manufacturing a platform by the method as defined in claim 1;
inserting an optical fiber into the through hole formed in the platform;
mounting an optical element over the platform; and
electrically connecting the optical element and the interconnecting line.

17. The method of manufacturing an optical module as defined in claim 16, further comprising:
a step of providing a resin to seal the optical element.

18. The method of manufacturing an optical module as defined in claim 17,
wherein as the resin, a resin having light transmitting properties is provided at least between the optical fiber and the optical element.

19. The method of manufacturing an optical module as defined in claim 16, wherein:
the mold has the first region, the second region provided in a position lower than the first region, and a third region provided between the first and the second regions;
the interconnecting line is adhered to the first or second region and also to the third region in the step of providing the interconnecting line; and
a semiconductor chip is provided in the third region of the platform.

20. A platform comprising:
a molded component formed of resin, the molded component having a through hole formed therein for inserting an optical fiber in the molded component; and
an interconnecting line put in the molded component, interconnecting line having first surfaces covered with the molded component and at least one second surface exposed from the molded component, the at least one second surface surrounded by a surface of the molded component so as to come together in a substantially planar surface.

21. The platform as defined in claim 20,
wherein an indent for receiving an optical element is formed in the molded component.

22. The platform as defined in claim 21, wherein:
the indent has a plurality of bottom surfaces in stepped form; and
the at least part of the interconnecting line is exposed on each of the bottom surfaces.

23. An optical module comprising: the platform as defined in claim 22; an optical fiber inserted in the through hole; and an optical element electrically connected to the interconnecting line and mounted over the platform, wherein the optical element is provided within the indent so as to face an end surface of the optical fiber facing in the direction of the indent; and wherein a semiconductor chip which is electrically connected to the interconnecting line is further provided within the indent to face a surface of the optical element opposite to the surface facing the optical fiber.

24. The platform as defined in claim 20,
wherein a recess is formed in the interconnecting line so that a bottom surface of the recess is exposed from the molded component.

25. The platform as defined in claim 24,
wherein the recess formed in the interconnecting line is filled with a conductive material.

26. The platform as defined in claim 20,
wherein an electronic component is incorporated in the molded component and is electrically connected to the interconnecting line.

27. An optical module comprising:
the platform as defined in claim 20;
an optical fiber inserted in the through hole; and
an optical element electrically connected to the interconnecting line and mounted over the platform.

28. The optical module as defined in claim 27, further comprising a resin to seal the optical element.

29. The optical module as defined in claim 28,
wherein as the resin, a resin having light transmitting properties is provided at least between the optical fiber and the optical element.

30. An optical transmission device comprising:
a plurality of the platforms as defined in claim 20;
an optical element mounted over each of the platforms; and
the optical fiber attached to each of the platforms,
wherein the optical element is a light-receiving element or light-emitting element; and
wherein the optical element is electrically connected to the exposed part of the interconnecting line.

31. The optical transmission device as defined in claim 30, wherein:
an indent for receiving the optical element is formed in the molded component;
a semiconductor chip is mounted over each of the platforms;
the optical element is provided within the indent to face an end surface of the optical fiber facing in the direction of the indent; and
the semiconductor chip is electrically connected to the interconnecting line, and is provided within the indent to face a surface of the optical element opposite to the surface facing the optical fiber.

32. The optical transmission device as defined in claim 30, further comprising a resin to seal the optical element.

33. The optical transmission device as defined in claim 32,
wherein as the resin, a resin having light transmitting properties is provided at least between the optical fiber and the optical element.

34. The optical transmission device as defined in claim 30, further comprising: a plug connected to the optical element.

* * * * *